United States Patent [19]

Izumida et al.

[11] Patent Number: 4,734,662
[45] Date of Patent: Mar. 29, 1988

[54] COMB FILTER

[75] Inventors: Masaaki Izumida; Sinya Nakai, both of Kanagawa; Akira Ohashi, Akita, all of Japan

[73] Assignee: TDK Corporation, Tokyo, Japan

[21] Appl. No.: 9,806

[22] Filed: Feb. 2, 1987

[30] Foreign Application Priority Data

Mar. 11, 1986 [JP] Japan ............................. 61-35815[U]
May 7, 1986 [JP] Japan ............................. 61-69136[U]
Oct. 1, 1986 [JP] Japan ............................ 61-151933[U]

[51] Int. Cl.⁴ ......................... H03H 7/01; H03H 9/05
[52] U.S. Cl. .................................... 333/174; 333/141; 333/188
[58] Field of Search ............... 333/167, 172, 174, 184, 333/185–189, 141–147, 175, 190–196; 361/380, 395, 397, 399, 400, 401, 415, 419, 427; 358/329; 310/345–351; 29/25.35

[56] References Cited

U.S. PATENT DOCUMENTS 3,992,686 11/1976 Canning .................................. 333/12
4,035,695 7/1977 Knutson et al. ................. 333/185 X
4,408,170 10/1983 Rapeli et al. .................... 333/185 X
4,492,928 1/1985 Hayakawa et al. ................. 333/142

FOREIGN PATENT DOCUMENTS 55-10203 1/1980 Japan .

OTHER PUBLICATIONS

Yanagida et al–"Glass Delay Lines for PAL Color TV Receiver Systems (Part 2)", Review of Showa Cables Co. Ltd., vol. 24, No. 1, published 1974; pp. 22-29.

Primary Examiner—Marvin L. Nussbaum
Attorney, Agent, or Firm—Martin M. Novack

[57] ABSTRACT

A comb filter for a television receiver set for separating a video signal into a color signal and an intensity signal has a single support with fixed holders for keeping a solid delay line circuit and a related process circuit in place. The holders have grooves or slits for accepting said solid delay line circuit and said process circuit. The process circuit has some adjustable electronic components which are adjusted by using a laser beam or sandblast so that dip frequency of the filter is adjusted. The adjustment is carried out before the filter is mounted on a television set so that no adjustment is necessary after the filter is mounted on the television set.

8 Claims, 9 Drawing Figures

COMB FILTER

BACKGROUND OF THE INVENTION

The present invention relates to a comb type filter having a hybrid IC (integrated circuit) having a ultrasonic wave solid delay line and its related process circuit. In particular, the present invention relates to such a filter which is mounted in a single housing, and the characteristics of the filter are subject to trimming in the production stage.

A comb type filter is used in a television receiver set for separating intensity signal and color signal.

FIG. 3 shows a circuit diagram of a separation circuit of intensity signal and color signal. In the figure, the numeral 1 is a video signal source, 2 is an ultrasonic wave solid delay line, 3 is a process circuit coupled with said delay line 2, C-OUT is an output terminal of color signal, Y-OUT is an output terminal of intensity signal. The process circuit 3 has impedance elements $Z_1$ through $Z_8$, variable resistors $VR_1$ and $VR_2$. The impedance elements $Z_1$ and $Z_6$ are used for providing impedance matching at input and output of the delay line 2. The impedance elements $Z_3$, $Z_7$ and $Z_8$ function to send signal from an input of the delay line 2 to an output of the same. The impedance element $Z_2$ and the variable resistor $VR_2$ adjust the level of the signal which is sent from input side to output side.

The variable resistors $VR_1$ and $VR_2$ adjust the characteristics of the filter. When the resistance of the variable resistor $VR_1$ is high, the dip frequency $f_a$ in FIG. 4 shifts to the low frequency, and when that resistance is low, that dip frequency shifts in the opposite direction. Therefore, the variable resistor $VR_1$ is adjusted so that the dip frequency $f_a$ coincides with the distribution of the color signal. Similarly, the variable resistor $VR_2$ adjusts the gain (or attenuation) of the comb filter.

Conventionally, an ultrasonic wave delay line 2 and a process circuit 3 in FIG. 3 are produced separately. And, the variable resistors $VR_1$, $VR_2$ and some other components which are subject to adjustment are provided as external components, which are attached to the circuit through a soldering process.

Accordingly, a prior comb filter has the disadvantage that the size is large. Further, it has the disadvantage that the adjustment of the variable components is troublesome, since the adjustment is carried out after the comb filter is assembled into a device, like a television receiver set. The adjustment of the comb filter at the production stage is impossible in the structure of a prior comb filter.

SUMMARY OF THE INVENTION

It is an object, therefore, of the present invention to overcome the disadvantages and limitations of a prior comb filter.

It is also an object of the present invention to provide a comb filter in which it is easy and to adjust the characteristics.

The above and other objects are attained by a comb filter having a support; a solid delay line fixed to said support, a process circuit having a substrate and electronic components of the comb filter on said substrate, some of said electronic components being subject to adjustment, a first holder fixed to said support, said first holder having a groove which accepts said solid delay line, a second holder fixed to said support, and second holder having a groove which accepts said substrate of the process circuit, a plurality of pins fixed to said substrate for external connection of the comb filter, a housing covering said process circuit and said solid delay line by being engaged with said support, said second holder being fixed in front of said first holder so that components on said substrate are adjusted without being covered by said solid delay line.

BRIEF DESCRIPTION OF THE DRAWINGS

The foregoing and other objects, features, and attendant advantages of the present invention will be appreciated as the same become better understood by means of the following description and accompanying drawings wherein.

DESCRIPTION OF THE PREFERRED EMBODIMENTS

Figure 1:
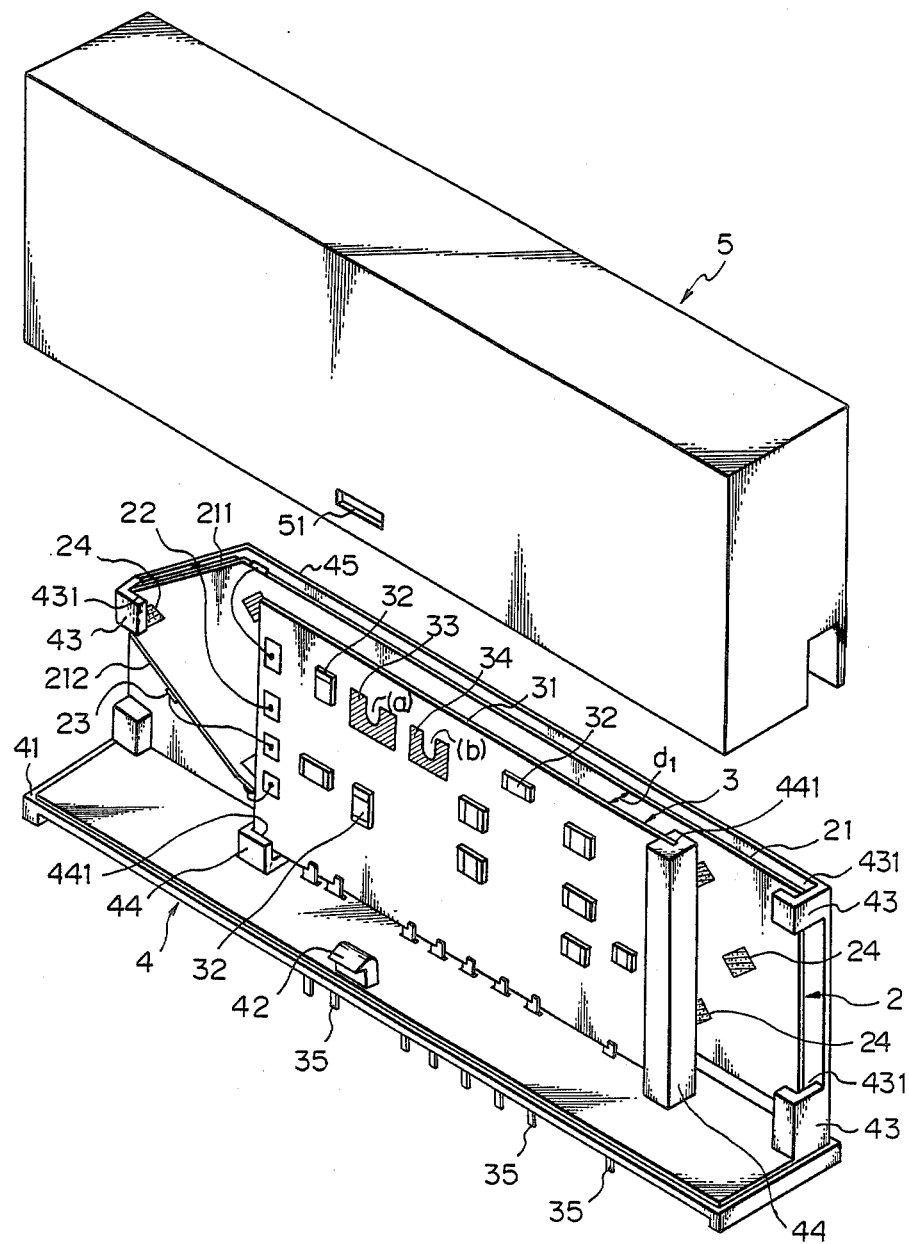
FIG. 1 is a perspective view of the present comb filter with cover removed.
Figure 2:
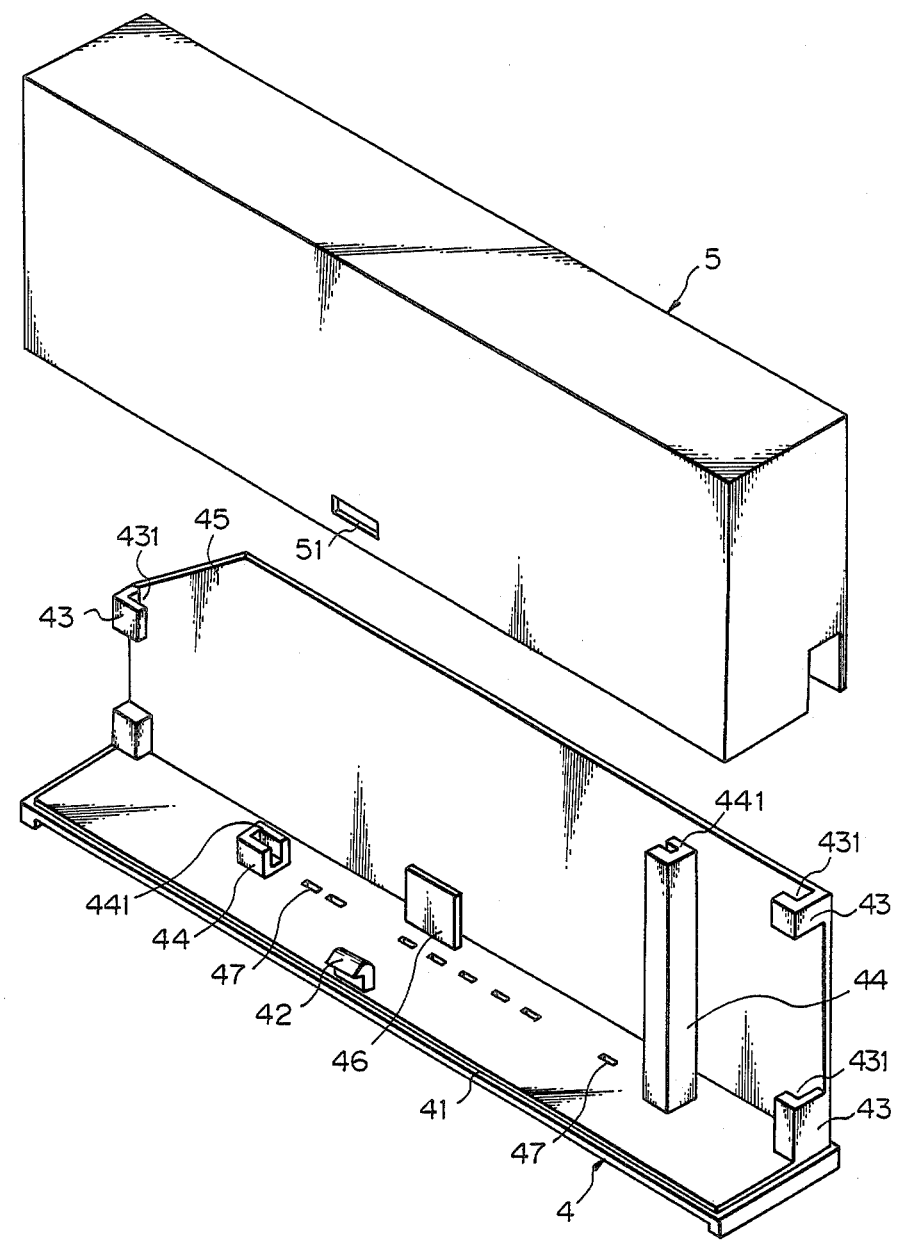
FIG. 2 is a perspective view of the housing of the comb filter according to the present invention.
Figure 5:
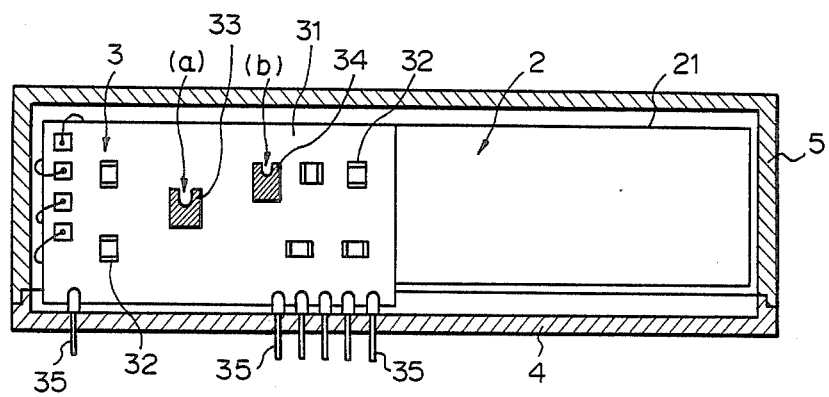
FIG. 5 is a plan view of the comb filter according to the present invention.
Figure 6:
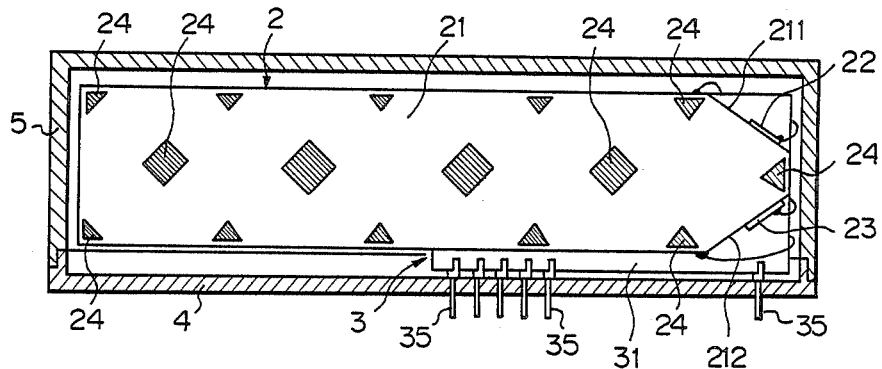
FIG. 6 is a back view of the comb filter of FIG. 5.
Figure 7:
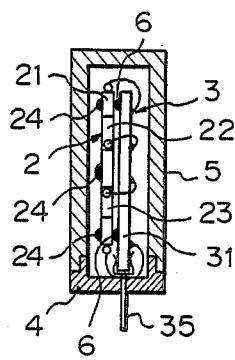
FIG. 7 is a side view of the comb filter of FIG. 5.

FIG. 1 is a perspective view of the comb filter according to the present invention, FIG. 2 is a perspective view of the housing of the comb filter of FIG. 1, FIG. 5 is a vertical view of the comb filter of FIG. 1, FIG. 6 is a back view of FIG. 5, and FIG. 7 is a side view of the comb filter of FIG. 1. In those figures, the numeral 2 is an ultrasonic wave solid delay line, 3 is a process circuit of that delay line, 4 is a support, and 5 is a cover which is a part of the housing.

The ultrasonic wave solid delay line 2 is a multi reflection type solid delay line having the delay medium 21 which is made of thin glass 21. The delay medium 21 has a pair of slanted sides 211 and 212 at the longitudinal end of the delay medium. The piezoelectric conversion elements 22 and 23 are attached to said slanted sides 211 and 212. A plurality of ultrasonic wave absorbers 24 are provided with a predetermined interval on one surface of the delay medium.

Figure 3:
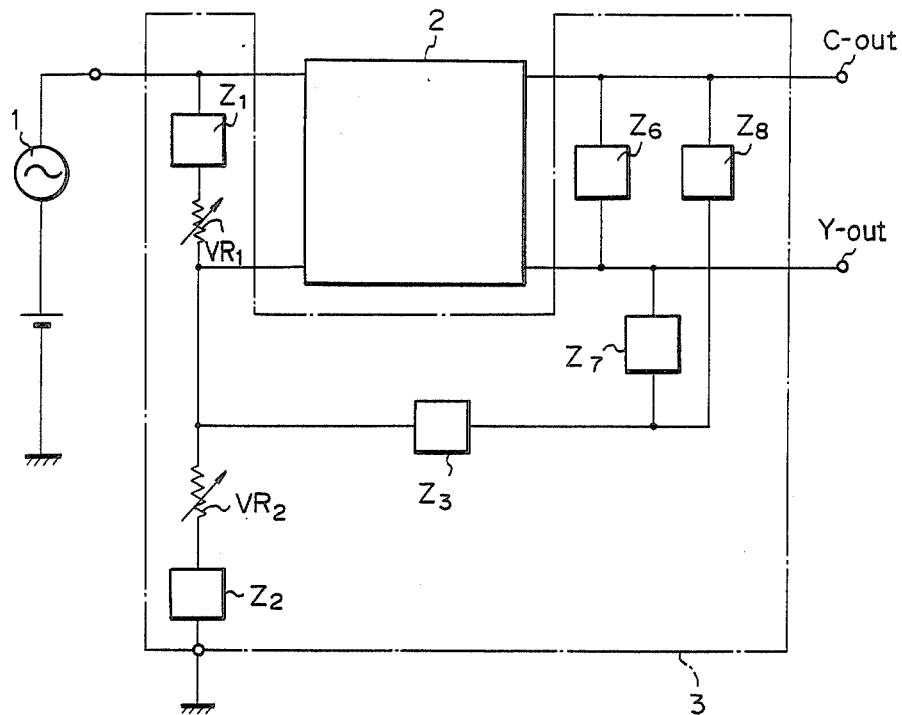
FIG. 3 is a circuit diagram of the electrical circuit which divides a video signal into an intensity signal and a color signal.

The process circuit 3 is a hybrid IC (integrated circuit) having a substrate 31 on which thick film components 32 for impedance elements $Z_1$ through $Z_8$ in FIG. 3 are mounted. Other thick film components 33 and 34 which are variable resistors $VR_1$ and $VR_2$ for adjusting the characteristics of the filter are mounted on the substrate 31. Those variable resistors 33 and 34 are subject to trimming to adjust the resistance of the resistors. The numeral 35 shows the pins for external connection of the circuit. Those pins are fixed to the substrate 31.

The support 4 and the cover 5 are of moulded plastics. The support 4 has a step 41 at the peripheral portion of the support 4, and the cover 5 is engaged with said step. A plurality of hooks 42 are provided at predetermined intervals on the peripheral of the support. Those hooks 42 snap with the holes 51 on the cover 5.

The support 4 has a first holder 43 having a groove or slit 431 for accepting the solid delay line 2, and the second holder 44 having the groove or slit 441 for securing the hybrid IC substrate 31. The support 4 has an integrated side wall 45, at both the ends of which the first holders 43 are provided, with the interval equal to the length of the solid delay line 2. Therefore, the support, the side wall and the holders are integrated, and are produced of single material.

The second holders 44 are mounted on the support 4. The interval of the second holders 44 is the same as the length of the substrate of the hybrid IC. The spacing $d_1$ is provided between the hybrid IC substrate and the solid delay line 2. The buffer 46 (FIG. 2) is attached on the support so that said spacing $d_1$ is provided to prevent the direct contact of the solid delay line with the hybrid IC substrate.

The numeral 47 shows holes which accept pins 35 for external connection of the hybrid IC circuit.

In the above structure, the solid delay line 2 is assembled in the filter merely by inserting the delay line into the groove 431 of the first holder 43. Therefore, the assembling process of the solid delay line in the present invention is very simple.

Further, since the second holder 44 having the groove 441 is provided in front of the first holder 43, the assembly of the hybrid IC circuit is finished merely by inserting the substrate into the groove 441 of the second holder 44.

The trimming of the variable resistors 33 and 34 is effected as shown by the symbol (a) and (b), after both the solid delay line and the hybrid IC substrate are inserted into the grooves. It should be noted that the variable resistors are mounted in front of the solid delay line, so that the trimming operation of the variable resistors is not prevented by the presence of the solid delay line. The trimming is effected with keeping in operation the solid delay line and the hybrid IC circuit on the support 4.

Figure 4:
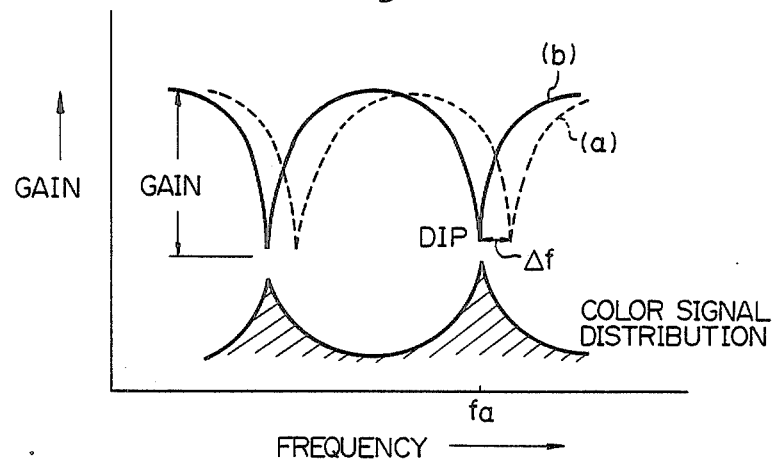
FIG. 4 shows characteristics of a comb filter.

The resistance of the thick film resistors 33 and 34 becomes high as the resistors are trimmed. Thus, the comb frequency $f_a$ and the gain of the filter in FIG. 4 are adjusted by trimming the thick film variable resistors 33 and 34.

When the trimming of the variable resistors is finished, the cover 5 is fixed to the support 4 so that the cover 5 secures the solid delay line and the hybrid IC substrate.

It should be noted of course that when the cover 5 is attached, the adjustment of the variable resistors has finished. Therefore, when the present filter is assembled in a device, for instance, a television receiver set, it is unnecessary to adjust the variable components.

Since the present process circuit is made of a thick film hybrid IC circuit, and the variable resistors are mounted on the substrate of the hybrid IC circuit by attaching a thick film on the same, the present comb filter is small in size and thin in width.

Figure 8:
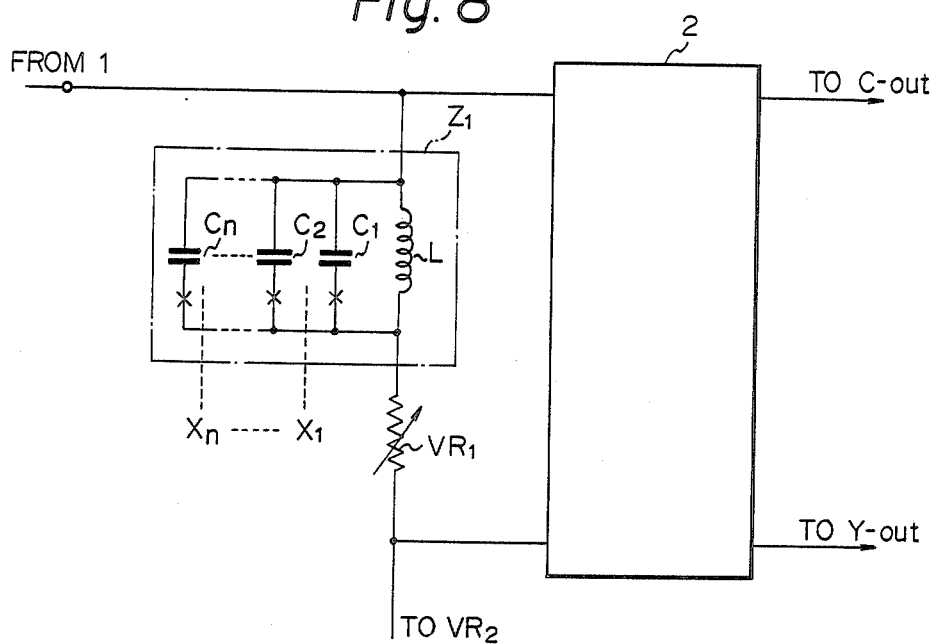
FIG. 8 is a circuit diagram of the modification of the comb filter according to the present invention.
Figure 9:
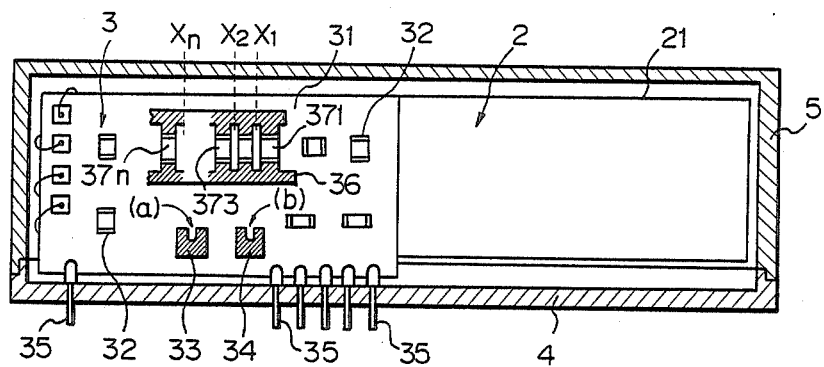
FIG. 9 is a modification of a plan view of the comb filter according to the present invention.

FIG. 8 shows the modification of the comb filter according to the present invention. The feature of the embodiment of FIG. 8 is the adjustment of the input impedance element $Z_1$, which is a parallel circuit of capacitance and inductance. The inductance is implemented by a fixed inductor L, and the capacitance C is implemented by a plurality of parallel connected capacitors $C_1, C_2, , , C_n$. Those capacitors are mounted on the substrate (FIG. 9) so that those capacitors are coupled between the lead lines 36. Each of the capacitors is, for instance, a chip-type capacitor.

The connection of each capacitor between the lead lines 36 is adjusted by cutting a lead line of a capacitor at the portion $X_1$, $X_2$, and/or $X_n$ by using a laser beam or by sandblasting. When the lead line of the capacitor is cut, that capacitor is removed from the circuit, and the resultant capacitance is reduced. The adjustment of the capacitance is carried out after the filter is manufactured and before the filter is mounted in a device (like a television receiver set).

Our experiment shows that the dip frequency of the filter depends upon the capacitance by 0.1 KHz/pF. And, when the adjustment of both the capacitance in the input impedance and the variable resistors is carried out, the range of the adjustment of the dip frequency reaches up to 4 KHz, which is sufficiently wide for the practical use of the filter. If the capacitance is not adjusted, the adjustment of only the variable resistors would provide a small adjustment of dip frequency of up to 1 KHz. In that case, the producing yield rate of a filter would be decreased.

Preferably, the capacitors $C_1, C_2, , , C_n$ are classified to two groups, one has relatively large capacitance for coarse adjustment, and the other has small capacitance for fine adjustment. Alternatively, the capacitance of each of the capacitors may have a binary ratio (e.g. 1;2;4;8).

Finally, the particular effects of the present invention are enumerated.

(a) The size of the filter is small, because a process circuit made of a hybrid IC together with a solid delay line are mounted in a single housing.

(b) The manufacturing process of the filter is simple, because the mounting of a solid delay line and a process circuit is carried out merely by inserting a delay line or a substrate of a process circuit into a groove or a slit of a holder.

(c) The adjustment of variable resistors and/or capacitors is carried out without removing the component from the housing, because the process circuit which mounts the variable resistors and the capacitors is mounted in front of the solid delay line which does not cover the process circuit. Therefore, the adjustment is carried out easily.

(d) All the adjustment is carried out beforehand. Therefore, no adjustment is necessary when the filter is mounted on a device, like a television receiver set.

(e) Since both the variable resistors and the capacitors are adjusted, the range of adjustment of dip frequency is large, and therefore, the manufacturing yield rate of a filter is high.

From the foregoing it will now be apparent that a new and improved comb filter has been discovered. It should be understood of course that the embodiments disclosed are merely illustrative and are not intended to limit the scope of the invention. Reference should be made to the appended claims, therefore, rather than the specification as indicating the scope of the invention.

What is claimed is:

1. A comb filter comprising;
a support;
an ultrasonic delay line element mountable on said support,
a process circuit board having a substrate and electronic components on said substrate, the electronic components being coupleable with said delay line element to implement a comb filter circuit, some of said electronic components on said process circuit board being subject to adjustment, a first holder fixed to said support, said first holder having a groove which accepts said delay line element, a second holder fixed to said support, said second holder having a groove which accepts said substrate of the process circuit board, a plurality of pins fixed to said substrate for external connection of the comb filter, a housing covering said process circuit board and said solid delay line by being engaged with said support, said second holder being fixed in front of said first holder so that components on said substrate can be adjusted without being covered by said delay line element.

2. A comb filter according to claim 1, wherein said first holder is made of plastic and is integral with said support.

3. A comb filter according to claim 1, wherein said electronic components subject to adjustment include a resistor which is subject to adjustment by trimming.

4. A comb filter according to claim 1, wherein said electronic components subject to adjustment include a plurality of capacitors coupled in parallel with one another, each of said capacitors having a lead line that is subject to cut so as to change the overall capacitance to the plurality of capacitors.

5. A comb filter according to claim 1, wherein said comb filter has a plurality of dip frequencies, and wherein said electronic components subject to adjustment control the dip frequencies of the comb filter.

6. A comb filter according to claim 1, wherein said electronic components which are subject to adjustment control the impedance matching of said delay line element.

7. A comb filter according to claim 3, wherein said variable resistor is a thick film resistor attached on said substrate.

8. A comb filter according to claim 4, wherein said capacitors are on a chip.

* * * * *